United States Patent [19]
Wyles et al.

[11] Patent Number: 5,751,005
[45] Date of Patent: May 12, 1998

[54] LOW-CROSSTALK COLUMN DIFFERENCING CIRCUIT ARCHITECTURE FOR INTEGRATED TWO-COLOR FOCAL PLANE ARRAYS

[75] Inventors: Richard H. Wyles, Carpinteria; William H. Frye, Goleta, both of Calif.

[73] Assignee: Raytheon Company, Lexington, Mass.

[21] Appl. No.: 770,311

[22] Filed: Dec. 20, 1996

[51] Int. Cl.[6] .................. H01L 27/146; H01L 31/101
[52] U.S. Cl. .................. 250/370.06; 250/370.08; 257/440
[58] Field of Search .................. 250/370.06, 332, 250/370.08, 338.4, 349; 257/440, 443

[56] References Cited

U.S. PATENT DOCUMENTS

| | | |
|---|---|---|
| 5,043,820 | 8/1991 | Wyles et al. |
| 5,113,076 | 5/1992 | Schulte |
| 5,149,956 | 9/1992 | Norton |
| 5,380,669 | 1/1995 | Norton |
| 5,457,331 | 10/1995 | Kosai et al. |
| 5,523,570 | 6/1996 | Hairston .................. 250/349 |
| 5,559,336 | 9/1996 | Kosai et al. .................. 250/370.13 |
| 5,581,084 | 12/1996 | Chapman et al. .................. 250/338.4 |

*Primary Examiner*—Edward J. Glick
*Assistant Examiner*—Darren M. Jiron
*Attorney, Agent, or Firm*—W. C. Schubert; G. H. Lenzen, Jr.

[57] ABSTRACT

An integrated two-color staring focal plane array is comprised of rows and columns of photodetector unit cells (10), each being capable of simultaneously integrating photocurrents resulting from the detection of two spectral bands. A readout circuit (20) in accordance with this invention performs a subtraction function, and includes a differential charge-sensing amplifier (22) in a one-per-column arrangement. The amplifier works in cooperation with circuitry (M5) located in each unit cell. The subtraction function is employed to create a separate Band1 signal from a Band2 and (Band1+Band2) signals generated by each simultaneous two-color detector (1). One significant advantage of the disclosed circuit embodiment is that it offers low spectral crosstalk between the two spectral bands.

16 Claims, 6 Drawing Sheets

LOW-CROSSTALK COLUMN DIFFERENCING CIRCUIT ARCHITECTURE FOR INTEGRATED TWO-COLOR FOCAL PLANE ARRAYS

FIELD OF THE INVENTION

The invention applies generally to focal plane arrays, and relates specifically to staring focal plane arrays that employ integrated photovoltaic detectors for simultaneously detecting infrared (IR) radiation within two spectral bands (i.e., "two-color detectors").

BACKGROUND OF THE INVENTION

A desirable type of photodetector is a two-color infrared radiation (IR) detector having sensitivity in two spectral bands. The spectral bands may include short wavelength IR (SWIR), medium wavelength IR (MWIR), long wavelength IR (LWIR), and very long wavelength IR (VLWIR). An array of two-color IR detectors may be employed in a number of imaging applications wherein it is required to simultaneously detect radiation within two spectral bands from a scene within a field of view of the array. By example, the array may detect LWIR and MWIR, or LWIR and SWIR.

Reference in this regard can be had to commonly assigned U.S. Pat. No. 5,113,076, issued May 12, 1992, entitled "Two Terminal Multi-band Infrared Radiation Detector" to E. F. Schulte. In this type of device the detection of a particular wavelength band is achieved by switching a bias supply.

Reference is also made to commonly assigned U.S. Pat. No. 5,149,956, issued Sep. 22, 1992, entitled "Two-Color Radiation Detector Array and Methods of Fabricating Same", by P. R. Norton, and to commonly assigned U.S. Pat. No. 5,380,669, issued Jan. 10, 1995, entitled "Method of Fabricating a Two-Color Radiation Detector Using LPE Crystal Growth", by P. R. Norton. Further in this regard reference can be had to commonly assigned U.S. Pat. No. 5,457,331 issued Oct. 10, 1995, entitled "Dual Band Infrared Radiation Detector Optimized for Fabrication in Compositionally Graded HgCdTe", by K. Kosai and G. R. Chapman.

Of particular interest herein are detectors that are capable of simultaneously sensing electromagnetic within the two bands of interest.

A conventional circuit for differencing the outputs of two simultaneously active photovoltaic radiation detectors is illustrated in FIG. 1. The two detectors are connected back-to-back (i.e., anode to anode) and are designated as a long wavelength (LW) detector, generating a photocurrent $I_{lw}$, and a medium wavelength (MW) detector, generating a photocurrent $I_{mw}$. The cathode of the LW detector is connected through a transistor to an integration capacitor $C_{lw}$, which in turn is connected to switch (not shown) controlled by a LW read and reset control signal. A LW bias control signal is applied to the gate of the LW transistor. The anodes of both the LW and MW detectors are connected through a transistor to an integration capacitor $C_{mw}$, which in turn is connected to a switch (not shown) controlled by a MW read and reset control signal. A MW bias control signal is applied to the gate of the MW transistor. The illustrated circuit is intended to directly readout the LW photocurrent signal, and to derive the MW photocurrent signal by subtracting the LW component from the MW component, using a current-loop technique.

One disadvantage of this approach is that the parasitic capacitance ($C_{parasitic}$) of the circuit introduces a significant amount of spectral crosstalk into the photocurrent signal derived from the subtraction. Known types of approaches to overcoming this limitation suffer from increased noise and increased circuit complexity.

OBJECTS OF THE INVENTION

It is a first object of this invention to provide a differencing readout circuit for use with two-color radiation detectors that overcomes the foregoing and other problems.

It is a second object of this invention to provide an array of two-color radiation detector unit cells or pixels, each being coupled to a photocurrent differencing circuit and each including circuitry for suppressing spectral crosstalk.

SUMMARY OF THE INVENTION

The foregoing and other problems are overcome and the objects of the invention are realized by methods and apparatus in accordance with embodiments of this invention.

This invention is directed to an integrated two-color staring focal plane array comprised of rows and columns of photodetectors, each being capable of simultaneously integrating photocurrents resulting from the detection of two spectral bands. A readout circuit in accordance with this invention performs a subtraction function, and includes a differential charge-sensing amplifier in a one-per-column arrangement. The amplifier works in cooperation with circuitry located in each unit cell. The subtraction function is employed to create a separate Band1 signal from the Band2 and (Band1+Band2) signals generated by each simultaneous two-color detector.

One significant advantage of the disclosed circuit embodiment is that it offers low spectral crosstalk between the two spectral bands. This is achieved with a relatively simple circuit implementation that further offers low noise performance, and that overcomes the problems of high spectral crosstalk, high noise, complex circuitry, and/or combinations of these disadvantages that are inherent in known types of circuitry.

In accordance with a method of this invention, and circuitry for implementing the method, there is taught a novel operation of a simultaneously active two-color detector. The two-color detector is of a type that has a first photodiode connected to a second photodiode at a common node. A second node of the first photodiode is coupled to a first capacitance and the common node is coupled to a second capacitance.

A first step of the method operates during a first portion of an integration period, and applies a short circuit to the first photodiode while integrating on the second capacitance a photocurrent generated only by the second photodiode. A second step of the method, executed during a second portion of the integration period, removes the short circuit and integrates on the second capacitance a photocurrent generated by the first photodiode and the photocurrent generated by the second photodiode, while simultaneously integrating on the first capacitance the photocurrent generated only by the first photodiode.

The method further includes the steps of, during a first portion of a readout period that follows the integration period, (a) coupling the first capacitance to a readout circuit; (b) storing and amplifying in the readout circuit a first potential resulting from the integrated photocurrent on the first capacitance; and during a second portion of the readout period, (c) coupling the second capacitance to the readout circuit; (d) subtracting in the readout circuit a second potential resulting from the integrated photocurrent on the second capacitance from the stored first potential to generate a difference potential; and (e) amplifying the difference potential in the readout circuit. A further step samples and holds the amplified first potential, and an optional step samples and holds the amplified difference potential.

In a presently preferred embodiment the two-color detectors are each included within an array of unit cells, such as a focal plane array. The array of unit cells is organized as rows and columns, and each unit cell of a column is switchably connected to one of the readout circuits. Each of the readout circuits includes a novel differential charge-sensing amplifier.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

The circuit of this invention is intended to operate with simultaneously active two-color detectors of a type that produce two signal currents: a Band1 current and a (Band1+ Band2) sum current. This particular two-color detector design is preferred because it is more readily fabricated than many other designs. Hereinafter Band1 is referred to as "LW" (Long-Wave) and Band2 is referred to as "MW" (Medium-Wave). However, the invention is not limited to any particular spectral bands, and this nomenclature is not intended to limit the scope of this invention. In fact, the spectral regions that may be utilized by other embodiments of this invention include, but are not limited to, the visible (approximately 0.4–0.8 micrometers), short wavelength IR (SWIR, approximately 0.8–3 micrometers), mid-wavelength IR (MWIR, approximately 3–8 micrometers), long wavelength IR (LWIR, approximately 8–12 micrometers), very long wavelength IR (VLWIR, approximately 12–20 micrometers), and the far IR (FIR, approximately 20–1000 micrometers). UV detectors can also benefit from the teaching of this invention.

Figure 1:
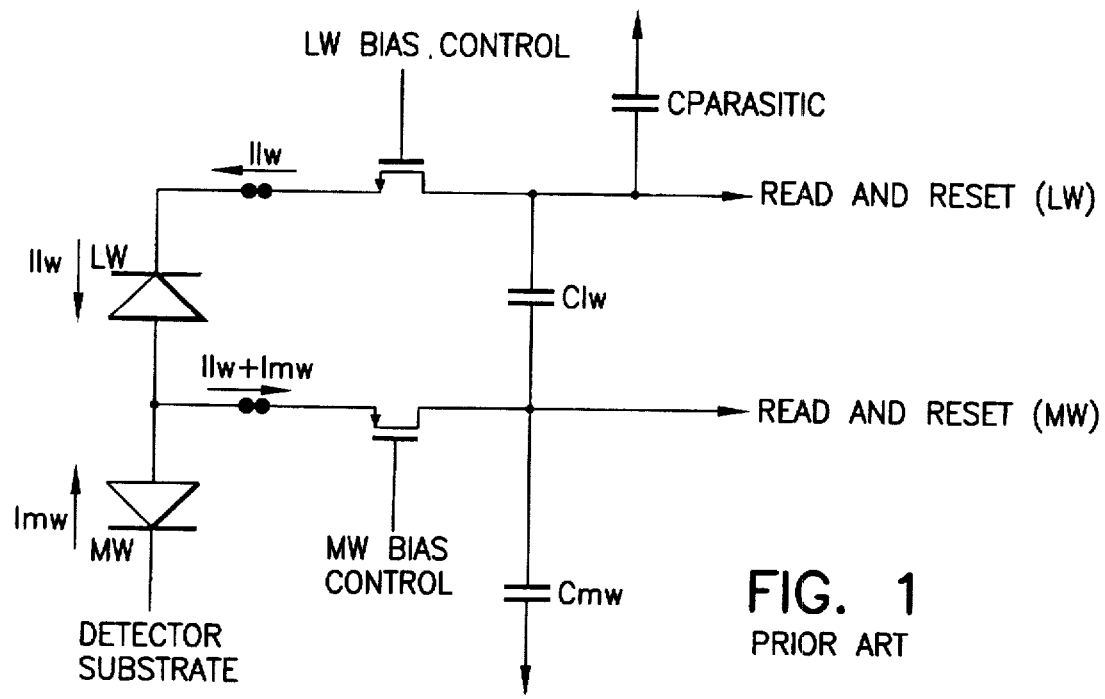
FIG. 1 is a simplified schematic diagram of a conventional simultaneously active two-color unit cell.
Figure 2A:
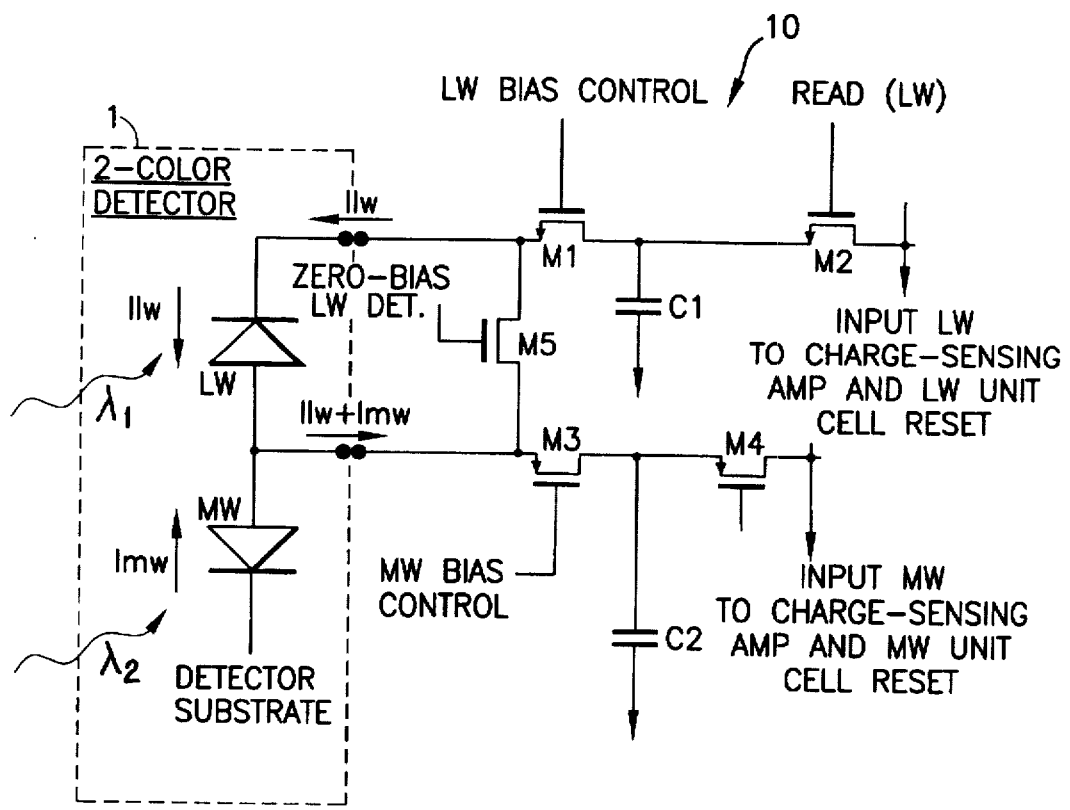
FIG. 2A is a schematic diagram of a two-color unit cell in accordance with this invention.
Figure 2B:
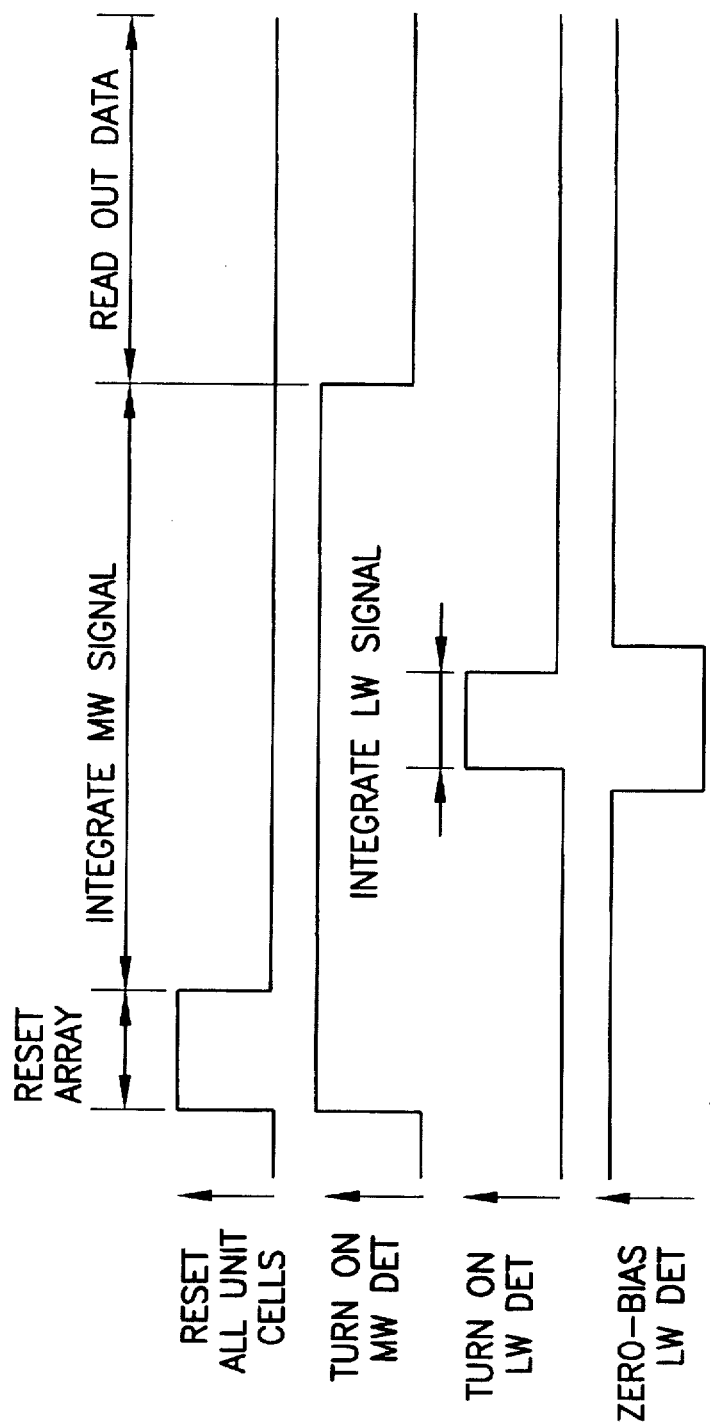
FIG. 2B is a timing diagram that illustrates the operation of the circuitry shown in FIG. 2A.

A two-color detector 1 is illustrated schematically within the dashed block in FIG. 2A, which illustrates a unit cell 10 in accordance with this invention. A simplified timing diagram for the unit cell of FIG. 2A is shown in FIG. 2B. It should be understood that unit cell 10 is typically one of a plurality of identical unit cells that are arranged in row (horizontal) and column (vertical) fashion within a Focal Plane Array (FPA). In the preferred embodiment of this invention the unit cells along each column of the FPA are sequentially coupled in a row-by-row fashion to a charge-sensing differential amplifier circuit of a type depicted in FIG. 3A. By example, for a FPA having N rows and M columns, there will be M of the charge-sensing differential amplifier circuits, the outputs of which are typically sequentially multiplexed onto a FPA readout bus. In this manner all of the unit cells from a first row (row i) are simultaneously processed by the M charge-sensing differential amplifier circuits and then sequentially output from the FPA, while all of the unit cells from a next row (row i+1) are being simultaneously input to and processed by the M charge-sensing differential amplifier circuits.

In the unit cell 10 depicted in FIG. 2A the LW (Band1) and MW (Band2) detectors are connected back-to-back (i.e., anode to anode). The LW detector generates the photocurrent $I_{lw}$ in response to LW IR radiation ($\lambda_1$), and the MW detector simultaneously generates the photocurrent $I_{mw}$ in response to MW IR radiation ($\lambda_2$). The cathode of the LW detector is connected through transistor M1 to an integration capacitor C1, which in turn is connected to a readout transistor M2. The output of M2 is an integrated LW photocurrent that is input to the differential charge-sensing amplifier 22 of the unit cell readout circuit 20 shown in FIG. 3A. A LW Bias Control signal is applied to the gate of the M1, and a Read(LW) timing signal is applied to the gate of M2. The anodes of both the LW and MW detectors are connected through a transistor M3 to an integration capacitor C2, which in turn is connected to a readout transistor M4. The output of M4 is an integrated (LW+MW) photocurrent that is input to the differential charge-sensing amplifier 22 of the unit cell readout circuit 20 of FIG. 3A. A MW Bias Control signal is applied to the gate of the M3, and a Read(MW) timing signal is applied to the gate of M4. The cathode of MW detector may be connected to the detector substrate potential.

In greater detail, the LW photocurrent from the LW detector flows through MOSFET M1 (which acts as a conventional direct-injection buffer) and integrates on capacitor C1. Simultaneously, (LW+MW) photocurrent from the MW and LW detectors flows through MOSFET M3 (another direct-injection buffer) and integrates on capacitor C2. The detector bias voltages, and the timing of the integration times for the two detectors, are controlled by the signals applied to the gates of the two buffer transistors, specifically the LW Bias Control and MW Bias Control signals. It is possible to integrate the MW photocurrent only, and not the LW current, during some portions of the overall integration time. This can be accomplished by applying appropriate signals to the gates of buffer transistors M1 and M3. By example, the LW photodiode can be turned off by applying an appropriate level to the gate of M1.

In accordance with an aspect of this invention, an additional transistor M5, connected in parallel with the LW detector, can be turned on only when the MW detector is integrating. Turning on M5 applies a short circuit around the LW detector, and thus effectively zero-biases the LW detector. When zero-biased, and assuming that the LW photodiode has been turned off by M1, no anomalous leakage or other currents are summed into the MW photocurrent. As a result, the current integrated on C2 is only the MW photocurrent. This arrangement reduces spectral crosstalk, as well as providing other benefits.

Figure 3A:
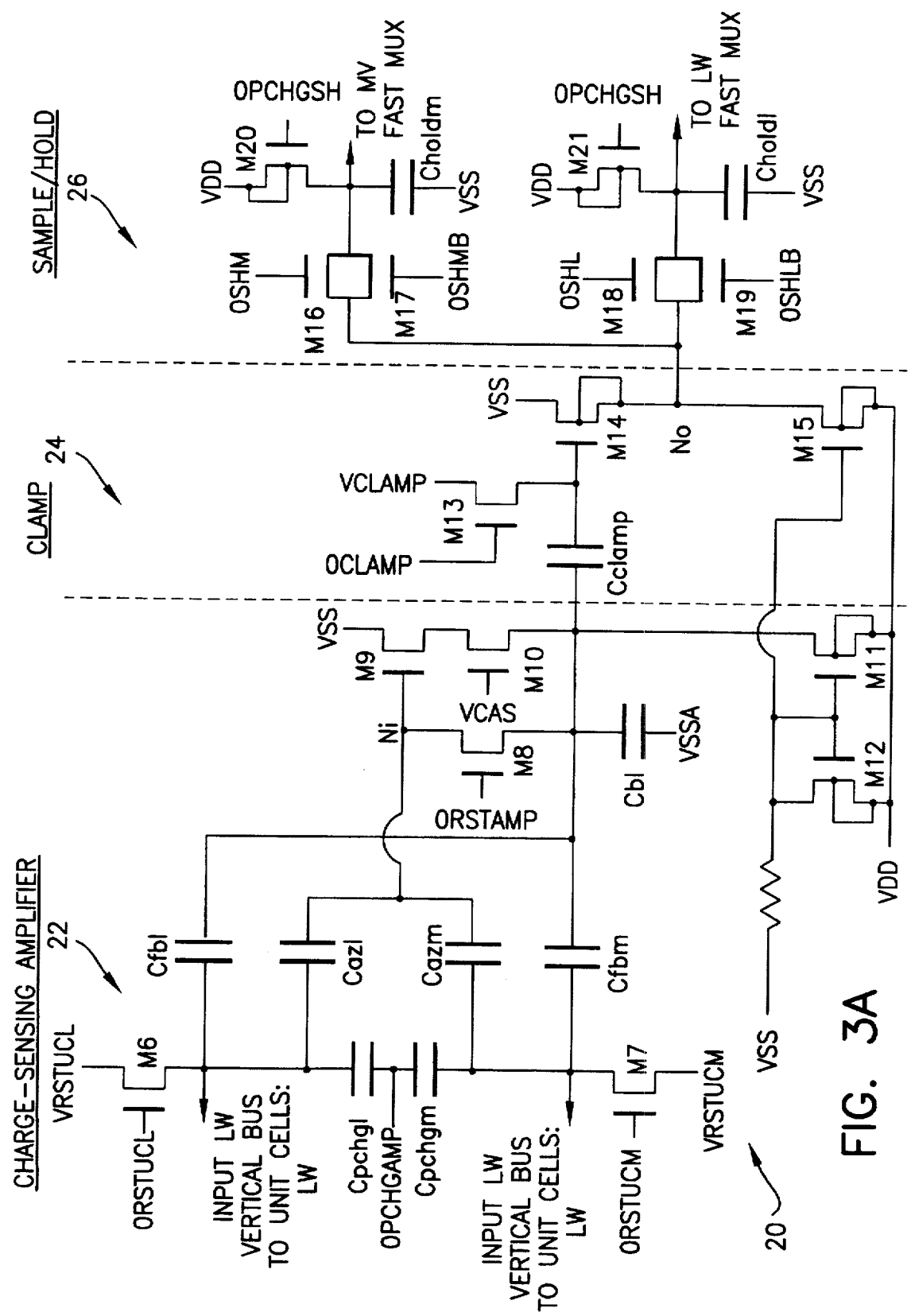
FIG. 3A is a schematic diagram of a one-per-column readout circuit having a differential charge-sensing amplifier in accordance with a preferred embodiment of this invention.

Transistor M2 resets the voltage on capacitor C1 at the beginning of an integration period, and is used to read the integrated LW charge signal into the one-per-column differential charge-sensing amplifier 20 shown in FIG. 3A. Transistor M4 performs the same function for capacitor C2.

As can be seen in the timing diagram of FIG. 2B, the MW integration period can be significantly longer than the LW integration period, which may then be nested within the MW integration period. Although one LW integration period is shown, a plurality of same can be provided within the MW integration period, if so desired. The LW integration period is initiated by turning off transistor M5 by bringing the Zero-Bias LW Detector signal low. This removes the short circuit across the LW detector, and allows the LW photocurrent to be integrated upon C1 (and also upon C2).

A presently preferred embodiment of the one-per-column charge-sensing differential amplifier (CSDA) 20 is illustrated in FIG. 3A. The CSDA 20 is comprised of a charge-sensing amplifier circuit 22, a clamp circuit 24 (optional), and a sample and hold (S/H) circuit 26. The CSDA 20 is a dual-input, capacitively-coupled amplifier circuit which precisely measures the difference in the charge signals placed at different times on two input terminals InputMW and InputLW. The CSDA 20 is an improvement over the circuit described in commonly assigned U.S. Pat. No. 5,043,820 (Aug. 27, 1991), "Focal Plane Array Readout Employing One Capacitive Feedback Transimpedance Amplifier for Each Column", by R. H. Wyles et al., the disclosure of which is incorporated by reference herein in its entirety.

Referring now also to FIG. 2A, the CSDA 20 operates in a two-stage sequence. First the LW signal is read from the unit cell (capacitor C1) through M2 into Input LW and the resulting LW voltage signal at the output of the amplifier 22 and clamp circuit 24 is stored on the LW portion of the S/H circuit 26. Next the (LW+MW) signal is read from the unit cell (capacitor C2) through M4 into InputMW. The differential charge-sensing amplifier 22 generates the difference signal ((LW+MW)–LW=MW) at its output. The difference voltage signal is stored on the MW portion of the S/H circuit 26. The charge subtraction can be performed with high precision if the open-loop gain of the differential charge sensing amplifier 22 is made very high (e.g. 500–1000), and if the two capacitors Cfbl and Cfbm are fabricated to be of substantially equal value (e.g., 1 pF).

Figure 3B:
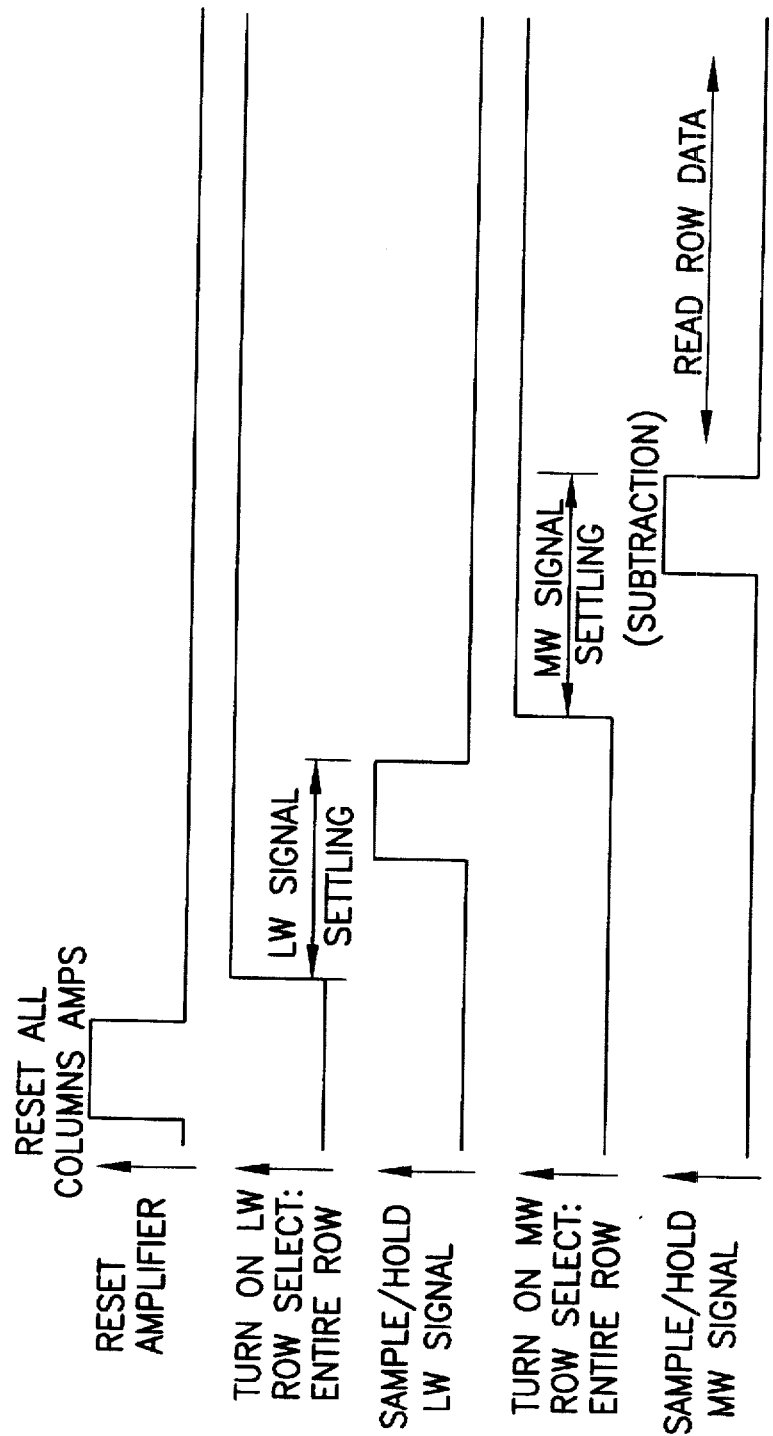
FIG. 3B is a timing diagram that illustrates the operation of the circuitry shown in FIG. 3A.

Referring now also to FIG. 3B, the read cycle starts sometime after the unit cells have integrated their signals, with the integrated signal charges being stored on C1 and C2 within each unit cell. Transistors M2 and M4 are off, thereby holding the integrated charge on C1 and C2, respectively. First the amplifier 22 and clamp circuit 24 are reset when transistors M8 and M13 are turned on by signals φRSTAMP and φCLAMP, respectively. Transistors M6 and M7 are also turned on by signals φRSTUCL and φRSTUCM, respectively, to drive the vertical unit cell buslines (Input MW and Input LW) to the unit cell reset voltages VRSTUCL and VRSTUCM, respectively. These buslines are connected in common to each unit cell 10 within the column. In this manner the Input LW is driven to the reset voltage for C1 and the Input MW is driven to the reset voltage for C2. Transistors M8, M13, and M6 are then turned off and transistor M7 remains on, which places the amplifier 22 into a charge-sensing mode for the input InputLW. M2 is turned on by the Read(LW) signal, thereby delivering the integrated LW charge signal to InputLW.

After the amplifier circuitry has settled, the LW voltage signal appearing across Cfbl appears equally on Cfbm. The appearance of an equal LW voltage signal also on Cfbm is important for the subsequent charge subtraction operation, as will be described shortly. The LW voltage signal appearing at the output node ($N_o$) of the amplifier 22 is then sampled and stored on Choldl for later readout through the optional clamp circuit 24 and a transmission gate, comprised of paralleled N and P channel MOSFETS M18, M19.

At this time transistor M7 is turned off and transistor M6 is turned on. This places the amplifier 22 into a charge-sensing mode for input InputMW. Transistor M4 (FIG. 2A) is turned on by the Read(MW) signal, delivering the (LW+MW) signal charge to Input MW of the amplifier 22. The (LW+MW) signal is then subtracted from the LW signal which was previously stored on feedback capacitance Cfbm, producing as a difference signal a potential that reflects the magnitude of only the integrated MW photocurrent. After the circuitry has settled, the resulting amplified voltage signal (MW only) at node $N_o$ is sampled and held on Choldm, via the optional clamp circuit 24 and the transmission gate comprised of transistors M16 and M17. At this point the signals on Choldl and Choldm can be read from the Focal Plane Array (FPA) using conventional multiplexing methods, and provided to suitable circuitry for performing a desired type or types of signal and/or image processing.

Figure 3C:
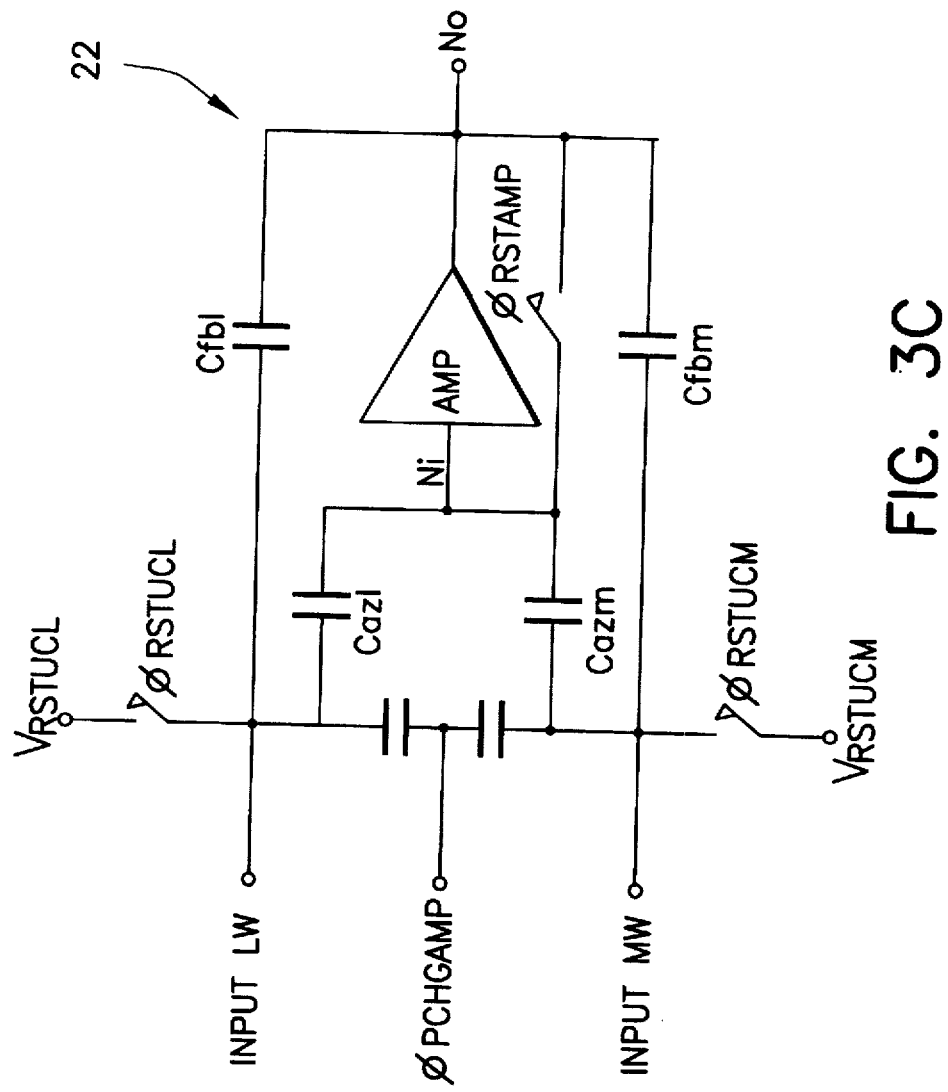
FIG. 3C is a simplified schematic diagram of the one-per-column readout circuit of FIG. 3A.

FIG. 3C is a simplified schematic diagram of the one-per-column readout circuit of FIG. 3A, and illustrates the connection of the feedback capacitances relative to the input node ($N_i$) of the high gain voltage amplifier (AMP).

It should be noted that the MW S/H circuit is optional, since the MW signal can also be read directly at the output node $N_o$ of the amplifier 22.

An auto-zero capacitor Cazl causes the voltage on Input LW to remain constant at the reset level during the read cycle, so that all of the LW charge integrated at the unit cell is forced onto Cfbl. Cazm performs the same function for the MW signal. Cpchgl (precharge lw) and Cpchgm (precharge mw) are optional capacitors which perform a DC level-shifting function at the output of the amplifier 22, under the control of signal φPCHGAMP (precharge amplifier). If used, the φPCHGAMP signal is toggled once per row readout period. Transistors M9 and M10 form a cascoded amplifier driver circuit, with the gate of M9 being the input node ($N_i$) of the amplifier. M11 and M12 form a current-source load for the amplifier. Cbl functions as a band-limiting (filter) capacitor. Transistor M14 functions as an optional source-follower buffer, and may be included whether or not the clamping circuit 24 is used. In general, the clamp circuit 24 can be employed to reduce noise resulting from the presence of an amplifier reset noise pedestal. Transistor M15 is the current-source load for M14.

Figure 4:
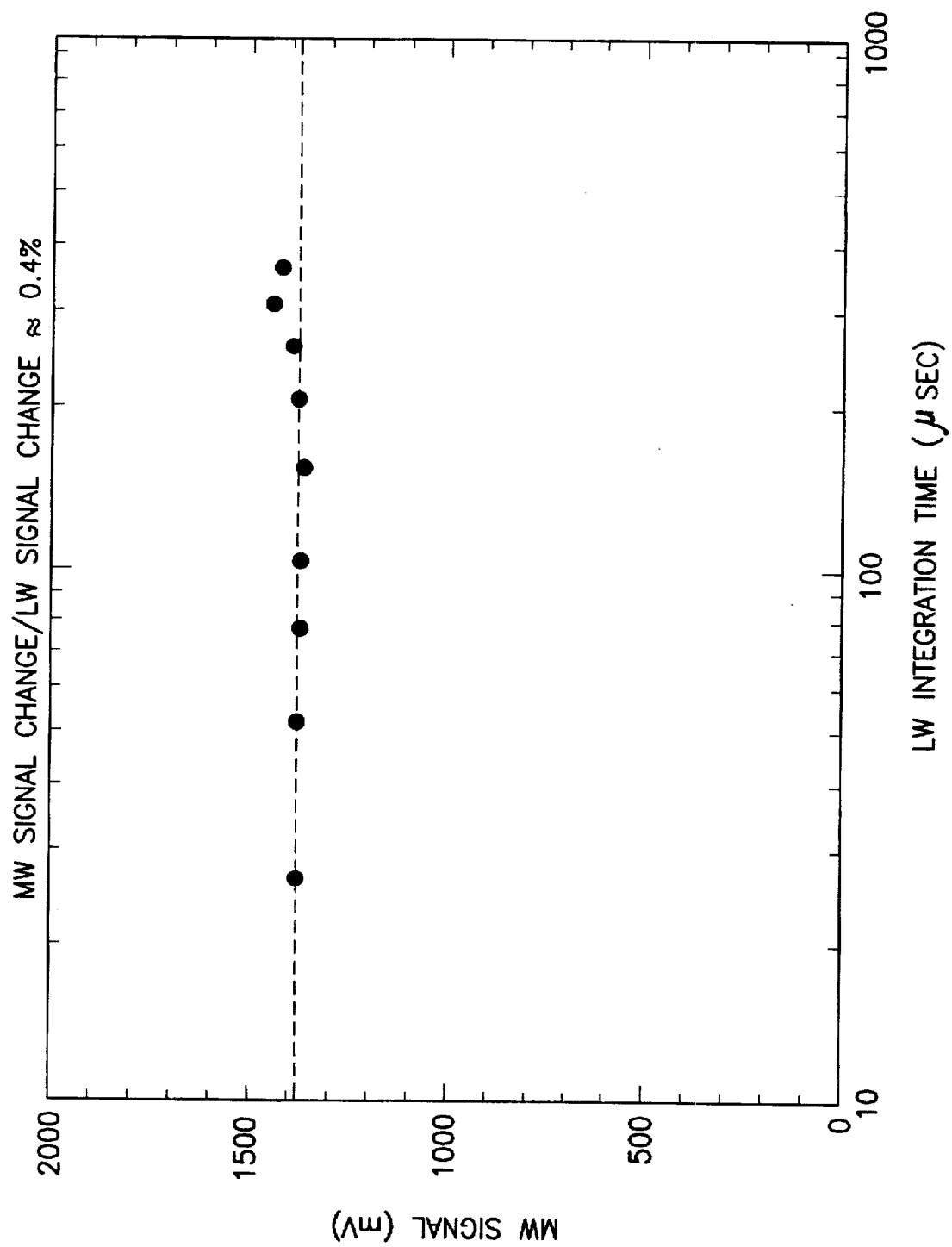
FIG. 4 is a graph depicting an MW output signal versus LW integration time, and shows the low level of spectral cross-talk that is achieved with the circuitry of this invention.

FIG. 4 is a graph showing exemplary spectral crosstalk data obtained with the circuitry disclosed in FIGS. 2A and 3A. The data clearly shows a low level of spectral crosstalk in the MW signal derived from the charge subtraction operation.

It should be pointed out that FIG. 3A illustrates one possible configuration of the circuitry of this invention, and that a number of modifications to the illustrated circuits may occur to those having skill in the art. That is, and by example, there may be a number of equivalent circuit architectures for realizing the (optional) DC level-shifting circuitry (Cpchgl and Cpchgm), the amplifier driver circuitry (M9 and M10), the amplifier current-source load circuitry (M15), the (optional) clamp circuitry 22, the (optional) source-follower buffer (M14), the LW sample-and-hold circuit (M18, M19, Choldl, M21), and the (optional) MW sample-and-hold circuit (M16, M17, Choldm, M20). It should thus be apparent that the invention can be practiced using only the amplifier driver circuitry (M9 and M10) and associated input and reset circuitry, including the feedback capacitances Cfb1 and Cfbm, the amplifier current-source load circuitry (M11 and M12), and the LW sample-and-hold circuit (M18, M19, Choldl, M21). Thus, any such variations and alternative embodiments should be construed to fall within the teaching of this invention.

It should further be realized that although the invention has been described in the context of a two-color photodetector architecture, the teachings of this invention may be applied as well, with suitable modifications, to photodetector types that are capable of detecting three or more spectral bands. Also, the teaching of this invention is applicable to radiation detectors having a single unit cell, and also to linear arrays of unit cells. Furthermore, the unit cell embodiment depicted in FIGS. 2A and 2B is not limited for use only with the charge-sensing differential amplifier embodiment of FIGS. 3A and 3B, and vice versa.

Thus, while the invention has been particularly shown and described with respect to preferred embodiments thereof, it will be understood by those skilled in the art that changes in form and details may be made therein without departing from the scope and spirit of the invention.

What is claimed is:

1. A method of operating a simultaneously active two-color detector of a type that has a first photodiode connected to a second photodiode at a common node, a second node of the first photodiode being coupled to a first capacitance and the common node being coupled to a second capacitance, comprising the steps of:

during a first portion of an integration period, turning off and zero-biasing the first photodiode while integrating on the second capacitance a photocurrent generated only by the second photodiode; and during a second portion of the integration period, turning on and removing the zero-bias from the first photodetector and integrating on the second capacitance a photocurrent generated by the first photodiode and the photocurrent generated by the second photodiode, while simultaneously integrating on the first capacitance the photocurrent generated only by the first photodiode.

2. A method as set forth in claim 1, and further comprising the steps of:

during a first portion of a readout period that follows the integration period, coupling the first capacitance to a readout circuit;

storing and amplifying in the readout circuit a first potential resulting from the integrated photocurrent on the first capacitance;

during a second portion of the readout period, coupling the second capacitance to the readout circuit;

subtracting in the readout circuit a second potential, resulting from the integrated photocurrent on the second capacitance, from the stored first potential to generate a difference potential; and amplifying the difference potential in the readout circuit.

3. A method as set forth in claim 2, wherein the step of storing and amplifying the first potential includes a step of sampling and holding the amplified first potential.

4. A method as set forth in claim 2, wherein the step of amplifying the difference potential includes a step of sampling and holding the amplified difference potential.

5. A focal plane array comprising a plurality of simultaneously active two-color detector unit cells arranged in rows and columns of unit cells, each of said unit cells comprising:

a first photodiode connected to a second photodiode at a common node, a second node of the first photodiode being coupled to a first capacitance and the common node being coupled to a second capacitance; and first switch means, operable during a first portion of an integration period, for establishing a short circuit around said first photodiode while enabling integration on said second capacitance of a photocurrent generated only by said second photodiode, said first switch means being operable during at least one second portion of said integration period for removing the established short circuit and for enabling integration on said second capacitance of a photocurrent generated by the first photodiode and the photocurrent generated by the second photodiode, while enabling simultaneous integration on said first capacitance of the photocurrent generated only by said first photodiode.

6. A focal plane array as set forth in claim 5, and further comprising:

a plurality of readout circuits each comprising an amplifier, individual ones of said readout circuits being switchably coupled to individual ones of unit cells within a column of unit cells;

said unit cell further comprising second switch means, operable during a first portion of a readout period that follows the integration period, for coupling said first capacitance to one of said plurality of readout circuits that is coupled to a column that contains said unit cell, said one of said readout circuits comprising means for storing a first potential resulting from the integrated photocurrent on said first capacitance, said storing means being coupled to an input of said amplifier wherein said first potential is amplified;

said unit cell further comprising third switch means, operable during a second portion of the readout period, for coupling said second capacitance to said one of said readout circuits that is coupled to said column that contains said unit cell, said one of said readout circuits further comprising means for subtracting a second potential resulting from the integrated photocurrent on said second capacitance from the stored first potential for generating a difference potential, said subtracting means being coupled to said input of said amplifier wherein said difference potential is amplified.

7. A focal plane array as set forth in claim 6, wherein said one of said readout circuits further comprises means for sampling and holding the amplified first potential.

8. A focal plane array as set forth in claim 7, wherein said one of said readout circuits further comprises means for sampling and holding the amplified difference potential.

9. A readout circuit for use with a detector that is responsive to electromagnetic radiation within at least two spectral bands, the detector having a first output node for outputting a photocurrent IBand1 resulting from electromagnetic radiation within a first spectral band, the detector having a second output node for outputting a combined photocurrent comprised of IBand1 and a photocurrent IBand2 resulting from electromagnetic radiation within a second spectral band, said readout circuit comprising:

amplifier means having an input node coupled to a first readout circuit input node and to a second readout circuit input node, said first readout circuit input node and second readout circuit input node coupling said amplifier means to said first output node and to said second output node, respectively, said first readout circuit input node being coupled also to a first amplifier means feedback capacitance and said second readout circuit input node being coupled also to a second amplifier means feedback capacitance;

means for selectively coupling, during a first interval of time, said first output node to said first readout circuit input node for causing said amplifier means to amplify a first potential and to impress the first potential upon both said first and said second amplifier means feedback capacitances, said amplified first potential being indicative of a magnitude of only the IBand1 photocurrent; and means for selectively coupling, during a second interval of time, said second output node to said second readout circuit input node for causing said amplifier means to amplify a difference potential between said first potential that is impressed upon said second amplifier means feedback capacitance and a second potential, said amplified difference potential being indicative of a magnitude of only the IBand2 photocurrent.

10. A readout circuit as set forth in claim 9, and further comprising means, coupled to an output of said amplifier means, for storing said amplified first potential during the second interval of time.

11. A readout circuit as set forth in claim 10, and further comprising means, coupled to said output of said amplifier means, for storing said amplified difference potential after the second interval of time.

12. A readout circuit as set forth in claim 9, and further comprising means, coupled between said first readout circuit input node and said second readout circuit input node, for level shifting an output of said amplifier means.

13. A readout circuit as set forth in claim 9, and further comprising reset means that is operative prior to said first interval of time, said reset means being coupled to said first readout circuit input node, to said second readout circuit input node, and to said amplifier means input node for resetting each to an initial voltage level.

14. A readout circuit as set forth in claim 13, and further comprising auto-zero means, coupled to said first readout circuit input node and to said second readout circuit input node, for maintaining said first readout circuit input node and said second readout circuit input node at said initial voltage level during the first and second intervals of time.

15. A readout circuit as set forth in claim 9, wherein said detector forms a part of a detector unit cell of an array of unit cells, each of said unit cells being comprised of simultaneously active two-color detectors arranged in rows and columns of unit cells, each of said unit cells comprising a first photodiode connected to a second photodiode at a common node, a second node of the first photodiode being coupled to a first capacitance and the common node being coupled to a second capacitance; each of said unit cells further comprising means, operable during a first portion of an integration period, for zero-biasing said first photodiode while enabling integration on said second capacitance of only the IBand2 photocurrent, said zero-biasing means being operable during a second portion of said integration period for removing the zero-bias of said first photodiode and for enabling integration on said second capacitance of both the IBand1 and IBand2 photocurrents, while enabling simultaneous integration on said first capacitance of only the IBand1 photocurrent.

16. A readout circuit as set forth in claim 15, wherein said common node is coupled to an anode of each of said first and second photodiodes.

* * * * *